United States Patent
Brandt

[19]

[11] Patent Number: 5,892,403
[45] Date of Patent: Apr. 6, 1999

[54] POWER INTERFACE CIRCUIT FOR A TDMA TRANSMITTER

[75] Inventor: Per-Olof Brandt, Staffanstrop, Sweden

[73] Assignee: Telefonaktiebolaget LM Ericsson, Stockholm, Sweden

[21] Appl. No.: 819,937

[22] Filed: Mar. 18, 1997

[51] Int. Cl.⁶ ....................................................... H03F 3/21
[52] U.S. Cl. ........................... 330/297; 455/127; 375/295
[58] Field of Search ..................................... 330/202, 298; 455/127; 375/295

[56] References Cited

U.S. PATENT DOCUMENTS

5,111,084  5/1992  Suko ..................................... 330/277 X
5,423,078  6/1995  Epperson et al. .................... 330/297 X
5,514,995  5/1996  Hennig .

*Primary Examiner*—James B. Mullins
*Attorney, Agent, or Firm*—Burns, Doane, Swecker & Mathis, L.L.P.

[57] ABSTRACT

A power interface circuit (64) is provided that uses an n-channel MOSFET (66) to control the switching of a power supply (46) to a TDMA power amplifier (58). When turned on, the n-channel MOSFET (66) connects the power supply (46) to the power amplifier (58), and when turned off, it disconnects the power supply from the power amplifier. The power interface circuit (64) includes a switch control circuit (70) that controls the switching state of the n-channel MOSFET (66) in response to a switch control signal. The switch control signal has a first binary state during which the n-channel MOSFET (66) is turned off and a second binary state during which the n-channel MOSFET is turned on.

34 Claims, 4 Drawing Sheets

SUPPLY CONTROL SIGNAL

FIG. 4

POWER INTERFACE CIRCUIT FOR A TDMA TRANSMITTER

BACKGROUND

This invention generally relates to the field of power interface circuits and, more particularly, to power interface circuits for time division multiple access (TDMA) transmitters.

TDMA communication systems have been widely used in today's digital cellular systems, to communicate voice and data between a plurality of portable or mobile transceiver units. In such systems, a radio frequency channel is subdivided into a number of TDMA channels comprising time slots during which the transceiver units communicate TDMA messages with each other. Each transceiver unit includes a TDMA transmitter that transmits bursts of messages during an assigned transmit channel and a TDMA receiver that receives the messages during an assigned receive channel.

In order to minimize battery current drain, a critical resource in the portable communication units, certain components of the TDMA transmitter and receiver may be energized only during their assigned channels. Moreover, even during the assigned channels, transmitter components may be turned off during periods of silence to still further reduce consumption. For example, each transmitter includes a radio frequency power amplifier (RFPA), which draws relatively significant battery current when energized. Thus, the transmitter is equipped with a power interface circuit that selectively couples the supply voltage to the RFPA only during an assigned transmit channel, to minimize battery current drain. Generally, such power interface circuit includes a switch that connects and disconnects the supply voltage to and from the RFPA under the control of a switch control signal.

Figure 1:
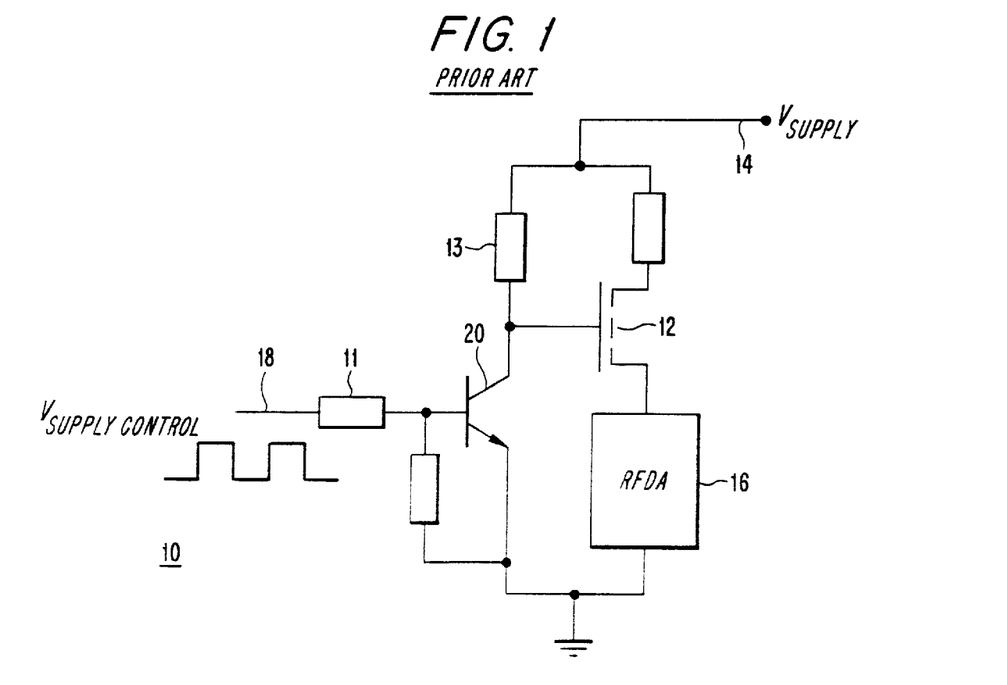
FIG. 1 is a schematic diagram of a conventional power interface circuit.

Conventionally, p-channel metal-oxide semiconductor field effect transistors (MOSFETs) have been used as switches in the power interface circuits. FIG. 1 shows schematic diagram of one conventional power interface circuit 10 that uses such p-channel MOSFET 12, which is biased through resistors 11 and 13 to selectively connect and disconnect a supply voltage provided on line 14 to an RFPA 16. In response to a voltage supply control signal on line 18, which has two binary states, the p-channel MOSFET is turned on to connect the supply voltage to the RFPA 16 during one binary state and is turned off to disconnect the supply voltage from the RFPA 16 during another binary state.

To turn on the p-channel MOSFET 12, a negative voltage is applied across the transistor's gate-to-source junction that increases (or enhances) the conductivity of its p-channel. Under the arrangement of FIG. 1, a negative gate voltage, i.e. ground, is applied to the p-channel MOSFET, through a bipolar transistor 20, to turn on the p-channel MOSFET, and a positive gate voltage, i.e. $V_{SUPPLY}$, is applied to turn it off.

Because of the desire to minimize the size and cost of portable communication units and increase their transmission speed, manufacturers are continuously searching for ways to reduce the size of the circuitry used in such units, while increasing their switching speed. Compared to p-channel MOSFETs, n-channel MOSFETs occupy two to three times less die space and provide faster switching speeds. They could also be configured to protect the RFPA from voltage peaks through simple regulation circuits, for example, by coupling a Zener diode at the gate of the MOSFET. Thus, the n-channel MOSFETs are an attractive alternative to p-channel MOSFETs in communication system switching applications.

Despite the advantages offered by the n-channel MOSFETs, their use in portable communication units have been limited because in order to use the n-channel MOSFET as a switch, the MOSFET must be biased to operate in an on-state. Biasing the n-channel MOSFET in the on-state requires application of a gate voltage that is more positive than the supply voltage; a task not easily achievable given the supply voltage is the highest voltage available in the communication unit.

Thus, there exists a need for a power interface circuit that can bias an n-channel MOSFET to provide selective switching between the supply voltage and the RFPA of a TDMA transmitter. The present invention addresses this need.

SUMMARY

The present invention that addresses this need is embodied in a power interface circuit that uses an n-channel MOSFET, to control the application of a supply voltage as provided by a power supply to a TDMA power amplifier. In response to a switch control signal, a switch control circuit controls the n-channel MOSFET to connect or disconnect the power supply to and from the TDMA power amplifier. The switch control signal has a first binary state during which the switch control signal has a first voltage level, and it had a second binary state during which the switch control signal has a second voltage level. The switch control circuit turns off the n-channel MOSFET to disconnect the power supply from the power amplifier during the first binary state, and it turns on the n-channel MOSFET to connect the power supply to the power amplifier during the second binary state.

In one of the exemplary features of the present invention, the n-channel MOSFET has a drain coupled to the power supply and a source connected to the power amplifier. The power interface circuit uses the first and second voltage levels of the switch control signal to control the switching state of the n-channel MOSFET by controlling a gate-to-source voltage level. During the first binary state, the power interface circuit uses the first voltage level to place the n-channel MOSFET in an off-state by producing a gate-to-source voltage level that is less than a threshold voltage level corresponding to the pinch-off voltage of the MOSFET. During the second binary state, the power interface circuit uses the second voltage level to place the n-channel MOSFET in an on-state by producing a gate-to-source voltage level that is greater than the threshold voltage. Under this arrangement, the N-channel MOSFET protects the power amplifier from supply voltage fluctuations. Alternatively, a Zener diode may be coupled to the gate of the n-channel MOSFET to regulate the gate voltage, thereby protecting the power amplifier.

According to other exemplary features of the present invention, the power interface circuit includes a capacitor that is charged during the first binary state, when the control signal, which is coupled to the gate of the n-channel MOSFET, provides the first voltage level that turns off the n-channel MOSFET. Subsequently, during the second binary state, the capacitor is connected to the gate of the n-channel MOSFET to provide the second voltage level that is equal to or greater than the threshold voltage that turns on the MOSFET. The second voltage level provided by the capacitor is substantially equal to the sum of the voltage level of the control signal during the second binary state and the voltage level to which the capacitor was charged to during the first binary state.

According to still other exemplary features of the present invention, the power interface circuit includes a reference voltage generator that produces a reference voltage level and a capacitor switch circuit that controls the connections of the capacitor. During the first binary state, the capacitor switch circuit connects the capacitor to the reference voltage generator, which charges the capacitor to the reference voltage level. During the second binary state, the capacitor switch circuit connects the capacitor to the gate of the n-channel MOSFET. The capacitor, which is coupled to the supply control signal, provides a gate voltage level that is substantially equal to the reference voltage level plus the level of control signal during the second binary state. The capacitor switch circuit includes MOSFETs in one exemplary embodiment of the invention and includes bipolar transistors in another exemplary embodiment.

Other features and advantages of the present invention will become apparent from the following description of the preferred embodiment, taken in conjunction with the accompanying drawings, which illustrate, by way of example, the principles of the invention.

DETAILED DESCRIPTION

Those skilled in the art will appreciate that the present invention can be applied in other environments. For example, transmitters used in other systems having different access methodologies (e.g., code division multiple access (CDMA) on frequency division multiple access (FDMA)) could also be controlled in accordance with the following techniques.

Figure 2:
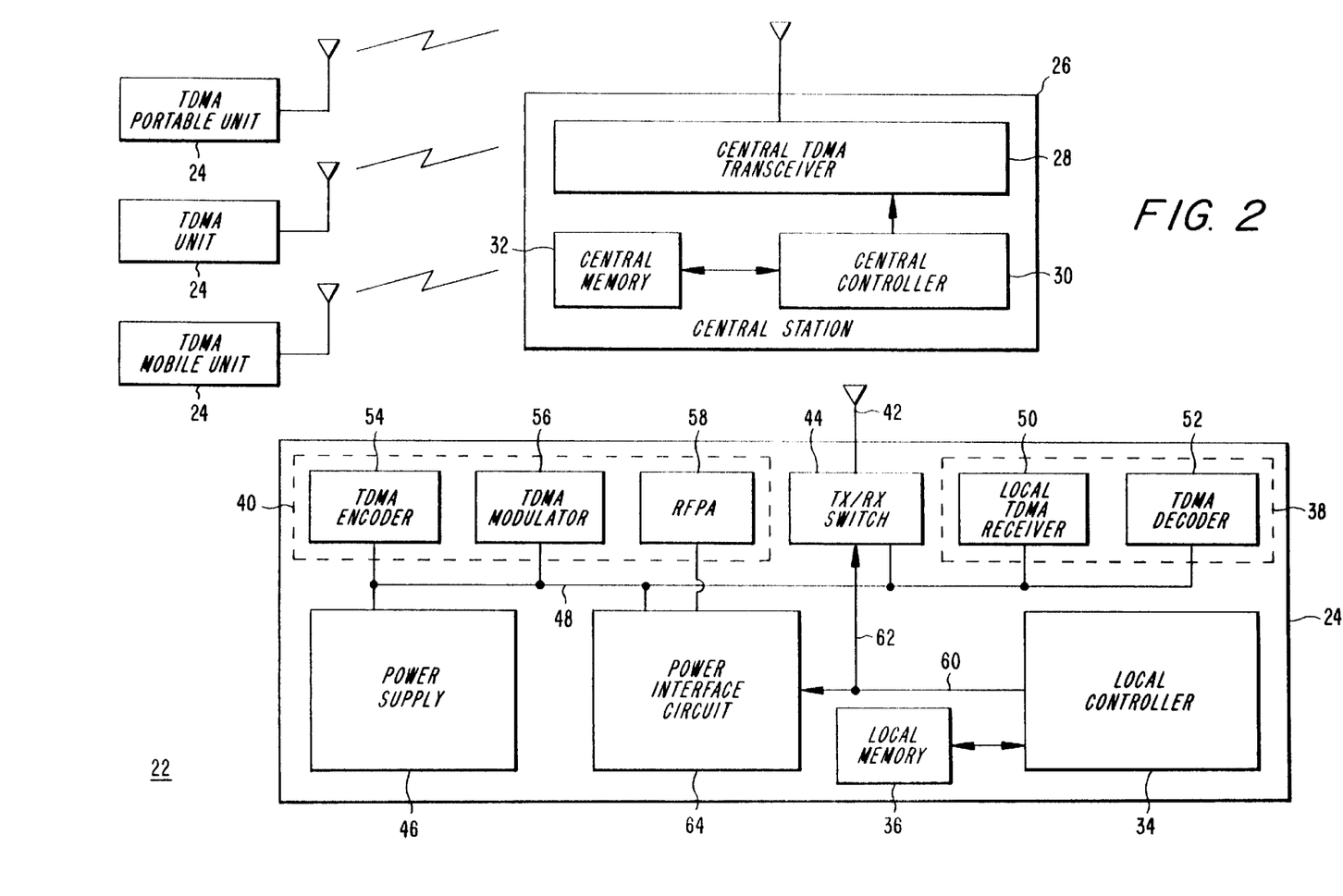
FIG. 2 is a block diagram of a TDMA communication system that advantageously uses an exemplary power interface circuit according to the present invention.

With respect to FIG. 2, there is shown a block diagram of an exemplary TDMA communication system 22 that includes a plurality of portable TDMA transceiver units 24 that communicate with each other through a central control station 26. The portable transceiver units and the central control station communicate with each other over one or more frequency channels that are subdivided into TDMA channels, which are time slots during which TDMA messages are communicated. The central station includes a central TDMA transceiver 28 that is configured to communicate the messages with the portable transceiver units in accordance with predefined RF modulation and demodulation techniques. A central controller 30 executes a central control program, which is stored in a central memory 32, to control the overall operation of the TDMA communication system, including the assignment of the TDMA channels and the routing of various data and control signals within the system.

Each portable transceiver unit 24 includes a local controller 34 that, under the control of a local control program stored in a local memory 36, controls the overall operation of the transceiver unit, including the transmission and reception of the TDMA messages during designated TDMA channels. The transceiver unit includes a TDMA receiver section 38 and a TDMA transmitter section 40 that are connected to a common antenna 42 via an RX/TX switch 44, which operates under the control of the local controller to couple the antenna to the transmitter section and the receiver section during corresponding transmit and receive channels. The transmitter section transmits bursts of messages, and the receiver section receives the messages during a designated TDMA receive channel. Additionally, the receiver section can also be used to make control or traffic channel measurements during other channels. A power supply 46, such as a battery, provides a supply voltage on line 48, which can be, for example, approximately 5 volts, to operate various sections of the transceiver unit.

The receiver section 38 includes a local TDMA receiver 50 that demodulates TDMA messages received through the antenna 42 during a corresponding receive channel. A TDMA decoder 52 decodes the received TDMA messages and delivers them to a user as an audio or text message. The transmitter section 40 includes a TDMA encoder 54 that appropriately encodes audio or text messages from the user into encoded TDMA messages and delivers them to a TDMA modulator 56. The modulated TDMA messages are applied to an RFPA 58 which, when energized during a corresponding TDMA transmit channel, amplifies the modulated messages and couples them, through the TX/RX switch 44, to the antenna. In accordance with the TDMA transmit and receive channel assignments of a particular transceiver unit 24, the local controller 34 generates a supply control signal on line 60, for controlling the switching of the power supply 46 and the RFPA 58, and it generates a TX/RX switch control signal on line 62, for controlling the switching of the TX/RX switch 44 between the receiver and the transmitter sections 38 and 40. The TDMA transmitter section includes a power interface circuit 64 that is configured according to the present invention, to provide the switching function between the supply voltage and the RFPA 58.

Figure 3:
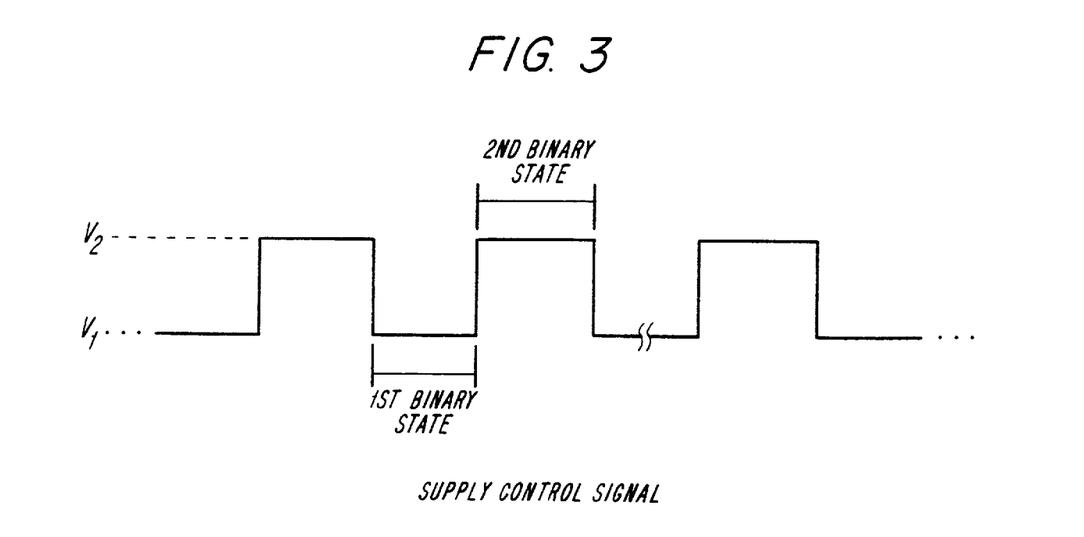
FIG. 3 is a timing diagram of a supply control signal generated by the TDMA communication system of the FIG. 2.

With reference to FIG. 3, a diagram of the supply control signal, which is generated by the local controller 34 on line 60, is shown. At any given time, the supply control signal is at one of two binary states: a first binary state when the power supply is disconnected from the RFPA 58, and a second binary state when the power supply is connected to the RFPA 58. During the first binary state, the supply control signal has a first voltage level $V_1$, e.g. zero volts, and during the subsequent second binary state, it has a second voltage level $V_2$, e.g. 3.75 volts. As described above, the duration of each first binary state corresponds to the period when the transmitter section 40 is disabled from transmitting, and the duration of each second binary state corresponds to the period when the transmitter section is enabled to transmit TDMA messages. Although FIG. 3 depicts an example wherein the supply control signal toggles the RFPA 58 on and off at approximately a 50% duty cycle, those skilled in the art will appreciate that this waveform is idealized for discussion purposes and that, in practice, the duty cycle will vary depending on, for example, the number of time slots per TDMA frame that a transceiver unit is transmitting, whether discontinuous transmission techniques are applied, etc.

According to the present invention, the power interface circuit 64 uses an n-channel MOSFET, which is turned off during the first binary state to disconnect the supply voltage from the RFPA 58 and is turned on during the second binary state to connect the supply voltage to the RFPA 58. The n-channel MOSFET is turned off by being biased to an off-state and is turned on by being biased placed to an on-state.

The power interface circuit 64 biases the n-channel MOSFET to the on-state by producing a gate-to-source voltage $V_{GS}$, i.e., the voltage across the gate and the source of the n-channel MOSFET, that is greater or more positive than a threshold voltage $V_T$ that corresponds to the pinch-off voltage of the MOSFET. As a result, negative charges are induced into the n-type channel increasing its conductivity and allowing drain current $I_D$ to flow, consequently, turning on the n-channel MOSFET. Under the current state of the art, the n-channel MOSFET used by the present invention requires a threshold voltage $V_T$ of about 2.5 volts, to provide maximum channel conductivity.

Conversely, to bias the n-channel MOSFET to off-state with minimum channel conductivity, the power interface circuit produces a gate-to-source voltage $V_{GS}$ of zero volts that is less than the threshold voltage $V_T$. This voltage will reduce the drain current $I_D$ to a negligible value, thus, turning off the n-channel MOSFET. According to one of the exemplary features of the present invention, the power interface circuit takes advantage of the first voltage level ($V_1$) and the second voltage level ($V_2$) of the supply control signal, to provide the biasing voltages for the n-channel MOSFET. More particularly, during the second binary state, the power interface circuit uses the second voltage level $V_2$ to provide a gate-to-source voltage $V_{GS}$ that is more positive than the threshold voltage $V_T$. As described later in detail, the gate-to-source voltage $V_{GS}$ during the second binary state is provided by connecting a capacitor to the gate of the n-channel MOSFET. The capacitor, which is initially charged during the first binary state, provides the more positive gate-to-source voltage $V_{GS}$ using the voltage level of the supply control signal during the second binary state.

Figure 4:
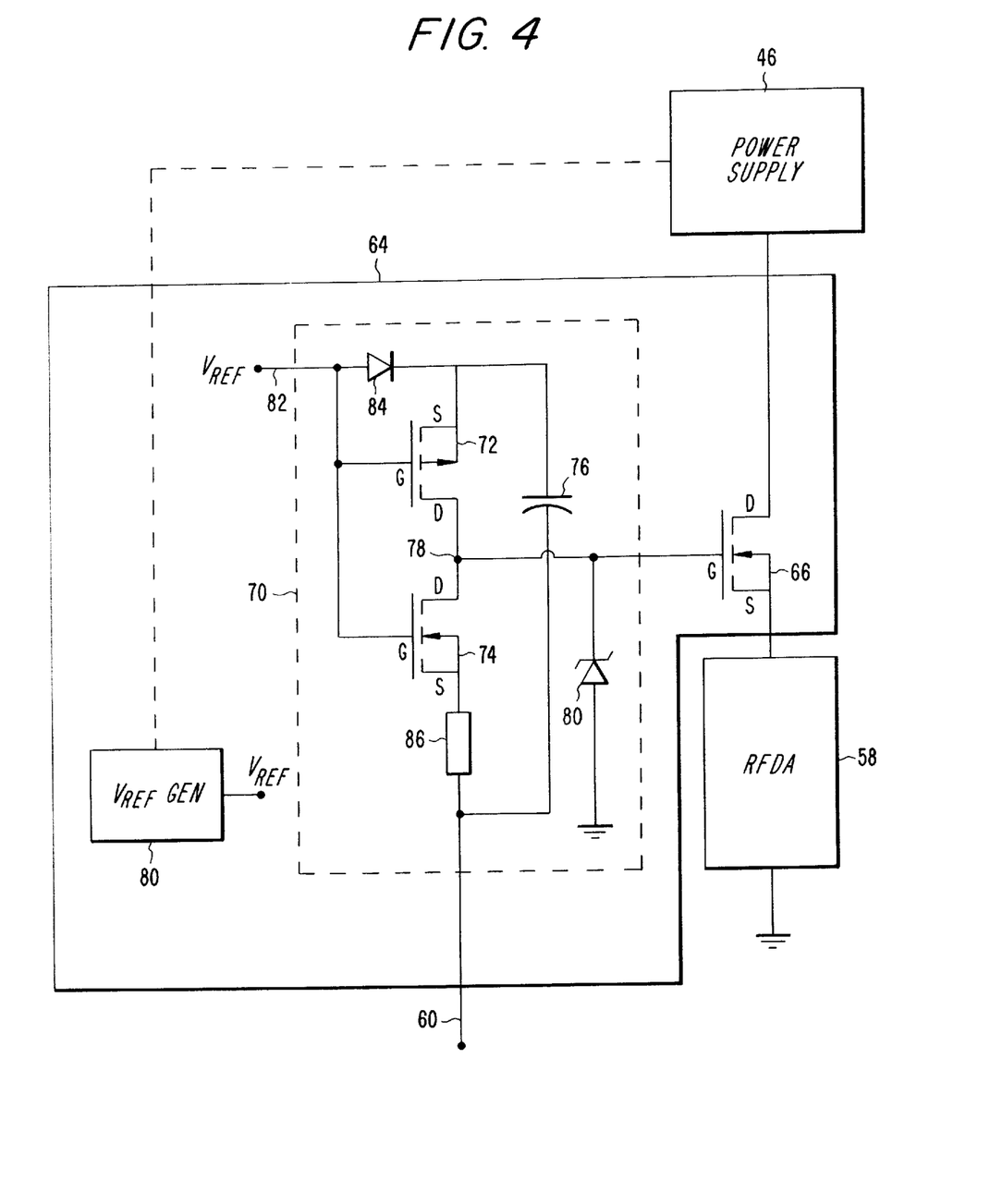
FIG. 4 is a schematic diagram of a power interface circuit according to one of the exemplary embodiments of the present invention.

FIG. 4 shows a schematic diagram of one exemplary embodiment of the power interface circuit 64 of the present invention. The power interface circuit includes an n-channel MOSFET 66 that is biased via the supply voltage, the RFPA 58, and a switch control circuit 70. The drain of the n-channel MOSFET 66 is coupled to the power supply, its source is coupled to the RFPA 58, and its gate is coupled to the switch control circuit 70.

In response to the supply control signal, the switch control circuit provides a gate voltage that controls the on-state and off-state of the n-channel MOSFET 66. Assuming the supply voltage provided by the power supply is 5 volts, the switch control circuit provides a gate voltage that is about 7.5 volts, i.e., $V_T$ of 2.5 volts above the battery supply voltage, which turns on the n-channel MOSFET 66. The switch control circuit 70 controls the switching state of the n-channel MOSFET 66 based on the binary state of the supply control signal. Using the first voltage level $V_1$ during the first binary state, the switch control circuit provides a first gate voltage that turns off the n-channel MOSFET by reducing the gate-to-source voltage $V_{GS}$ to zero volts, which is less than the threshold voltage $V_T$. Using the second voltage level $V_2$, the switch control circuit turns on the n-channel MOSFET by increasing the gate-to-source voltage $V_{GS}$ to a voltage level that is greater than the threshold voltage $V_T$. In this way, the switch control circuit 70 operates the n-channel MOSFET in the on-state and off-state, in response to the voltage levels of the supply control signal during the first and second binary states.

As shown in FIG. 4, the switch control circuit 70 according to this embodiment of the present invention includes a complementary MOSFET pair comprising a p-channel MOSFET 72 and an n-channel MOSFET 74 that are connected to each other in series, and a capacitor 76 that is coupled across the complementary MOSFET pair. The p-channel MOSFET 72 and the n-channel MOSFET 74 have a common junction 78 at their drains that is Connected to the gate of the n-channel MOSFET 66, to provide the gate voltage. In one exemplary embodiment, the switch control circuit 70 includes a reference voltage generator 80 that generates a reference voltage $V_{ref}$ on line 82 substantially equal to the second voltage level $V_2$, which in this example is about 3.75 volts. In another exemplary embodiment, the reference voltage is provided by the power supply 46, as shown by the dotted lines. Thus, the reference voltage $V_{ref}$ may also be equal to the supply voltage. The reference voltage $V_{ref}$ is coupled to the gates of the p-channel MOSFET 72 and the n-channel MOSFET 74. The reference voltage $V_{ref}$ also couples to the source of the p-channel MOSFET 72 and to one end of the capacitor through a diode 84. The supply control signal on line 60 is coupled to the other end of the capacitor and to the source of the n-channel MOSFET 74, through a resistor 86. Under this arrangement, the p-channel and the n-channel MOSFETs 72 and 74 function in a complementary manner with respect to each other. That is, when the p-channel MOSFET 72 is on the n-channel MOSFET 74 is off, and vice versa.

During the first binary state, when the supply control signal is at the first voltage level $V_1$ of zero volts, the reference voltage turns off the p-channel MOSFET 72 and turns on the n-channel MOSFET 74. As a result, the capacitor 76 is charged to the reference voltage level $V_{ref}$. Consequently, the first voltage level $V_1$ of zero volts is applied as the gate voltage to the n-channel MOSFET 66, which operates the n-channel MOSFET 66 in the off-state and disconnects the power supply 46 from the RFPA 58.

During the second binary state, when the supply control signal rises to the second voltage level $V_2$ of 3.75 volts, the n-channel MOSFET 74 turns off. At the same time, the supply control signal, which is coupled to the capacitor 76, produces a source voltage at the p-channel MOSFET 72 the reference voltage level $V_{ref}$ plus the second voltage level $V_2$. This source voltage turns on the p-channel MOSFET 72 to connect the capacitor 76 to the gate of the n-channel MOSFET 66. As a result, the capacitor applies a gate voltage to the n-channel MOSFET 66 equal to the reference voltage level $V_{ref}$ plus the second voltage level $V_2$. The gate voltage so produced insures a positive gate-to-source voltage of about 2.5 volts (7.5 volts gate voltage minus 5 volts supply voltage at the source) is developed, to operate the n-channel MOSFET 66 in the on-state. When operating in the on-state, the n-channel MOSFET connects the supply voltage to the RFPA 58, which enables the transmission of the TDMA messages during the second binary state. Accordingly, the complementary MOSFETs 72 and 74 constitute a capacitor switch circuit that is responsive to the supply control signal, to control the charging of the capacitor during the first binary state and the second binary state.

A Zener diode 73, shown in dotted line, may be coupled to the gate of the n-channel MOSFET 76 to regulate the gate voltage. For example, a zener diode with 7.5 volts breakdown voltage insures that the gate voltage is equal to 7.5 V, when the supply voltage is used as the reference voltage. It may be appreciated that under the arrangement described in FIG. 4, the RFPA 58 is protected from voltage variations of the supply voltage. This is mainly because the voltage applied to the RFPA 58 is ret by a source voltage that follows the gate voltage independent of the variations at the drain, which is coupled to the supply voltage. The gate voltage level is set by the reference voltage, which in one exemplary embodiment is independently generated from the supply voltage by the reference voltage generator 80. In case the reference voltage is supplied by the power supply, as in the other exemplary arrangement described above, the regulating Zener diode 73 makes the gate voltage independent of the voltage variations of the supply voltage.

Figure 5:
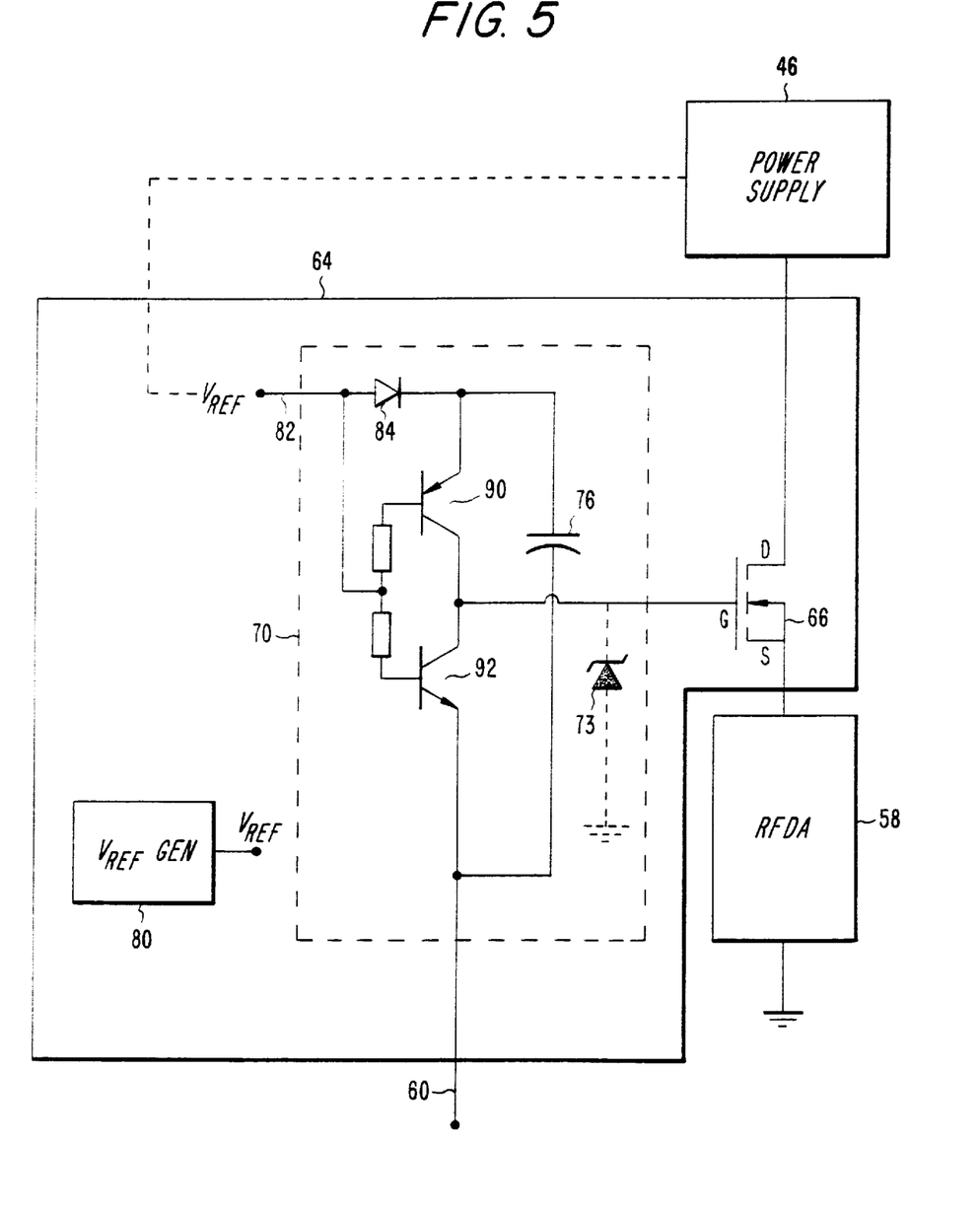
FIG. 5 is a schematic diagram of a power interface circuit according to another exemplary embodiment of the present invention.

With reference to FIG. 5, a second exemplary embodiment of the invention which operates similar to the arrangement of FIG. 4, uses a PNP bipolar transistor 90 and an NPN bipolar transistor 92, instead of the MOSFETs 72 and 74, for implementing the switch control circuit 70. During the first binary state, the PNP transistor 90 is open and the NPN 92 transistor is closed, thereby charging the capacitor 76 to the voltage reference, while applying the first voltage level $V_1$ to the gate of the n-channel MOSFET 66. As a result, the n-channel MOSFET 66 is turned off, disconnecting the power supply 46 from the RFPA 58. During the second binary state when the NPN transistor 92 is open, the PNP transistor 90 closes. As a result, the gate-to-source voltage at the n-channel MOSFET turns on the n-channel MOSFET 66 and connecting the power supply to the RFPA.

From the foregoing description it will be appreciated that the present intention provides a simple and effective arrangement for using an n-channel MOSFET in the power interface circuit of a TDMA transmitter, thus reducing the size of such circuit and increasing its switching speed. The present invention takes advantage of the voltage levels provided by the supply control signal to raise the gate-to-source potential across the n-channel MOSFET to a more positive level than that provided by the power supply of the transceiver unit. In this way, the n-channel MOSFET is selectively operated in the on-state or off-state, to control the switching function between the power supply and the RFPA.

Although the invention has been described in detail with reference only to the presently preferred embodiment, those skilled in the art will appreciate that various modifications can be made without departing from the invention. Accordingly, the invention is defined only by the following claims which are intended to embrace all equivalents thereof.

What is claimed is:

1. A power interface circuit for a power amplifier, comprising:
    a power supply that supplies a supply voltage to the power amplifier;
    an n-channel MOSFET coupled between the power supply and the power amplifier that selectively connects the supply voltage to the power amplifier;
    a switch control circuit that controls the n-channel MOSFET in response to a supply control signal, the supply control signal having a first binary state during which the n-channel MOSFET is turned off and a second binary state during which the n-channel MOSFET is turned on, wherein the supply control signal produces a first gate voltage to turn off the n-channel MOSFET and produces a second gate voltage to turn on the n-channel MOSFET; and
    a Zener diode that is coupled to the n-channel MOSFET to regulate the second gate voltage independently of the supply voltage.

2. The power interface circuit of claim 1, wherein the supply control signal has a first voltage level during the first binary state MOSFET and a second voltage level during the second binary state, wherein the n-channel MOSFET is responsive to the first voltage level to be turned off and it is responsive t the second voltage level to be turned on.

3. The power interface circuit of claim 2, wherein the n-channel MOSFET includes a gate-to-source junction, and wherein the first voltage level produces the first gate voltage across the gate-to-source junction of the n-channel MOSFET, and the second voltage level produces the second gate voltage across the gate-to-source junction of the n-channel MOSFET.

4. The power interface circuit of claim 3, wherein the switch control circuit includes a capacitor that applies the second gate voltage.

5. The power interface circuit of claim 3, wherein the first gate voltage is less than a threshold level.

6. The power interface circuit of claim 3, wherein the second gate voltage is greater than or equal to a threshold level.

7. The power interface circuit of claim 4 further including a reference voltage generator that generates a reference voltage; wherein during the first binary state, the capacitor is charged to the reference voltage level, and during the second binary state, the supply control signal is coupled to the n-channel MOSFET through the capacitor.

8. The power interface circuit of claim 7 further including a capacitor switch circuit that is responsive to the supply control signal, for controlling the connections of the capacitor during the first binary state and the second binary state.

9. The power interface circuit of claim 8, wherein the capacitor switch circuit includes MOSFETs.

10. The power interface circuit of claim 8, wherein the capacitor switch circuit includes bipolar transistors.

11. The power interface circuit of claim 7, wherein the reference voltage is provided by the power supply, and wherein the Zener diode is coupled to the gate of the n-channel MOSFET to regulate the second gate voltage at a level that is greater than the threshold level.

12. The power interface circuit of claim 7, wherein the n-channel MOSFET has a drain coupled to the supply voltage and a source coupled to the power amplifier.

13. A power interface circuit for a power amplifier, comprising:
    a power supply that supplies a supply voltage to the power amplifier;
    an n-channel MOSFET coupled between the power supply and the power amplifier that connects the supply voltage to the power amplifier when biased in an on-state and disconnects the supply voltage from the power amplifier when biased in an off-sate; and
    a switch control circuit that controls the n-channel MOSFET in response to a supply control signal producing a first gate voltage level during a first binary state that biases the n-channel MOSFET in the off-state and a second gate voltage level during a second binary state that biases the n-channel MOSFET in the on-state; and
    a Zener diode that is coupled to the n-channel MOSFET to regulate the second gate voltage independently of the supply voltage.

14. The power interface circuit of claim 13, wherein the first voltage level produces a first gate voltage across a gate-to-source junction of the n-channel MOSFET, and the second voltage level produces a second gate voltage.

15. The power interface circuit of claim 14, wherein the switch control circuit includes a capacitor that applies the second gate voltage.

16. The power interface circuit of claim 14, wherein the first gate voltage is less than a threshold level.

17. The power interface circuit of claim 14, wherein the second gate voltage is greater than or equal to the threshold level.

18. The power interface circuit of claim 14, wherein the Zener diode is coupled to the gate of the n-channel MOSFET to regulate the second gate voltage at a level that is greater than the threshold level.

19. The power interface circuit of claim 13, wherein the n-channel MOSFET has a drain coupled to the supply voltage and a source coupled to the power amplifier.

20. A time division multiple access transmitter, comprising:

a power amplifier;

a power supply that supplies a supply voltage to the power amplifier;

an n-channel MOSFET coupled between the power supply and the power amplifier that connects the supply voltage to the power amplifier when turned on and disconnects the supply voltage from the power amplifier when turned off; and a switch control circuit that controls the n-channel MOSFET in response to a supply control signal, the switch control signal having a first binary state during which the n-channel MOSFET is turned off and a second binary state during which the n-channel MOSFET is turned on; and a Zener diode that is coupled to the n-channel MOSFET to regulate a gate voltage that turns on the n-channel MOSFET independently of the supply.

21. The time division multiple access transmitter of claim 20, wherein the supply control signal has a first voltage level during the first binary state that turns off the n-channel MOSFET and a second voltage level during the second binary state that turns on the n-channel MOSFET.

22. The time division multiple access transmitter of claim 21, wherein the first voltage level produces a first gate voltage across a gate-to-source junction of the n-channel MOSFET, and the second voltage level produces a second gate voltage.

23. The time division multiple access transmitter of claim 22, wherein the switch control circuit includes a capacitor that applies the second gate voltage during the second binary state.

24. The time division multiple access transmitter of claim 22, wherein the first gate voltage is less than a threshold level.

25. The time division multiple access transmitter of claim 22, wherein the second gate voltage is greater than or equal to the threshold level.

26. The time division multiple access transmitter of claim 23 further including a reference voltage generator that generates a reference voltage; wherein during the first binary state, the capacitor is charged to the reference voltage level, and during the second binary state, the supply control signal is coupled to the n-channel MOSFET through the capacitor.

27. The time division multiple access transmitter of claim 26 further including a capacitor switch circuit that is responsive to the supply control signal, for controlling the connections of the capacitor during the first binary state and the second binary state.

28. The time division multiple access transmitter of claim 27, wherein the capacitor switch circuit includes MOSFETs.

29. The time division multiple access transmitter of claim 27, wherein the capacitor switch circuit includes bipolar transistors.

30. The power interface circuit of claim 26, wherein the reference voltage is provided by the power supply, and wherein the Zener diode is coupled to the gate of the n-channel MOSFET to regulate a second gate voltage that is greater than the threshold level.

31. The time division multiple access transmitter of claim 20, wherein the n-channel MOSFET has a drain coupled to the supply voltage and a source coupled to the power amplifier.

32. A method for selectively providing a supply voltage to a power amplifier, comprising:

supplying a switch control signal having a first binary state and a second binary state;

turning off an n-channel MOSFET during the first binary state, to disconnect the supply voltage from the power amplifier;

turning on the n-channel MOSFET during the second binary state to connect the supply voltage to the power amplifier; and regulating a gate voltage that turns on the n-channel MOSFET independently of the supply voltage.

33. The method of claim 32, wherein the switch control signal has a first voltage level during the first binary state that turns off the n-channel MOSFET and a second voltage level during the second binary state that as turns on the n-channel MOSFET.

34. The method of claim 32, wherein the first voltage level produces a first gate voltage across a gate-to-source junction of the n-channel MOSFET that is less than a threshold level, and the second voltage level produces a second gate voltage that is greater than the threshold level.

* * * * *

UNITED STATES PATENT AND TRADEMARK OFFICE
CERTIFICATE OF CORRECTION

PATENT NO. : 5,892,403
DATED : April 6, 1999
INVENTOR(S) : Per-Olof Brandt

It is certified that error appears in the above-indentified patent and that said Letters Patent is hereby corrected as shown below:

Title page, item [75] Inventor's residence should read --

Staffanstorp, Sweden--

In the figures 1, 4, and 5 numeral references 16 and 58 should be --RFPA--

In Fig. 4 (also on first page of Patent) numeral no. "80" should be --73--;

Column 7, line 14 replace "open" with --closed--;

Column 7, line 15 replace "closed" with --open--;

Column 7, line 20 replace "open" with --closed--;

Column 7, line 21 replace "closes" with --opens--;

Column 8, line 2 replace "t" with --to--.

Signed and Sealed this

Eighteenth Day of April, 2000

Attest:

Q. TODD DICKINSON

*Attesting Officer*           *Director of Patents and Trademarks*